(12) United States Patent
Epstein et al.

(10) Patent No.: US 6,833,283 B2
(45) Date of Patent: Dec. 21, 2004

(54) METHODS FOR FABRICATING POLYMER LIGHT EMITTING DEVICES BY LAMINATION

(75) Inventors: Arthur J. Epstein, Bexley, OH (US); Yunzhang Wang, Columbus, OH (US); Runguan Sun, Shanghai (CN)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 10/196,524

(22) Filed: Jul. 16, 2002

(65) Prior Publication Data

US 2003/0022409 A1 Jan. 30, 2003

Related U.S. Application Data

(60) Provisional application No. 60/308,194, filed on Jul. 27, 2001.

(51) Int. Cl.[7] ............................................. H01L 21/00
(52) U.S. Cl. ........................... 438/82; 438/99; 438/780
(58) Field of Search ..................... 438/82, 99, 780, 438/FOR 135, FOR 157, FOR 287

(56) References Cited

U.S. PATENT DOCUMENTS

| | | | |
|---|---|---|---|
| 5,137,991 A | | 8/1992 | Epstein et al. .............. 525/540 |
| 5,247,190 A | * | 9/1993 | Friend et al. ................. 257/40 |
| 5,663,573 A | | 9/1997 | Epstein et al. ................ 257/40 |
| 5,739,545 A | * | 4/1998 | Guha et al. .................... 257/40 |
| 5,804,917 A | * | 9/1998 | Takahashi et al. .......... 313/504 |
| 5,920,080 A | * | 7/1999 | Jones ........................... 257/40 |
| 5,962,962 A | * | 10/1999 | Fujita et al. ................. 313/412 |
| 5,965,979 A | | 10/1999 | Friend et al. ............... 313/504 |
| 6,069,443 A | * | 5/2000 | Jones et al. ................. 313/504 |
| 6,150,668 A | * | 11/2000 | Bao et al. ..................... 257/40 |
| 6,198,092 B1 | * | 3/2001 | Bulovic et al. .......... 250/214.1 |
| 6,465,953 B1 | * | 10/2002 | Duggal ........................ 313/553 |
| 6,469,437 B1 | * | 10/2002 | Parthasarathy et al. ..... 313/504 |
| 6,522,067 B1 | * | 2/2003 | Graff et al. .................. 313/512 |
| 6,558,820 B2 | * | 5/2003 | Raychaudhuri et al. ..... 428/690 |
| 6,566,806 B1 | * | 5/2003 | Kawai ......................... 313/504 |
| 6,576,975 B2 | * | 6/2003 | Yang .......................... 257/499 |

FOREIGN PATENT DOCUMENTS

| | | |
|---|---|---|
| WO | WO 99/07189 A1 | 2/1999 |
| WO | WO 99/55121 A1 | 10/1999 |
| WO | WO 01/17319 A1 | 3/2001 |
| WO | WO 01/78163 A1 | 10/2001 |

OTHER PUBLICATIONS

J. H. Burroughes, J. H., et al., *Light–Emitting Diodes Based on Conjugated Polymers*, Nature 347, 539 (1990).
Wang, Y. Z., et al., *Color Variable Bipolar/AC Light–Emitting Devices on Conjugated Polymers*, Appl. Phys. Lett. 70, 3215 (1997).
Wang, Y. Z., *New Approach to Color Variable Light–Emitting Devices Based on Conjugated Polymers*, Proc. SPIE 3148, 117 (1998).
Wang, Y. Z., *Polarity– and Voltage–Controlled Color–Variable Light–Emitting Devices Based on Conjugated Polymers*, Appl. Phys Lett. 74, 2593 (1999).

* cited by examiner

*Primary Examiner*—George Fourson
*Assistant Examiner*—Fernando L. Toledo
(74) *Attorney, Agent, or Firm*—Standley Law Group LLP

(57) ABSTRACT

The present invention includes methods for fabricating polymer light emitting devices by lamination. The invention also includes methods for fabricating electroluminescent polymer devices and electroluminescent polymer systems, and machines or instruments using those aspects of the invention.

50 Claims, 2 Drawing Sheets

METHODS FOR FABRICATING POLYMER LIGHT EMITTING DEVICES BY LAMINATION

This application claims the benefit of U.S. Provisional Application Ser. No. 60/308,194, filed on Jul. 27, 2001, which is incorporated herein by reference.

The present invention arose through work supported in part by Office of Naval Research. The United States Government may have certain rights to this invention under 35 U.S.C. Section 200 et seq.

TECHNICAL FIELD OF THE INVENTION

This invention relates to light-emitting devices driven by an electric field and which are commonly referred to as electroluminescent devices.

BACKGROUND OF THE INVENTION

Conjugated polymer based light-emitting devices have become a topic of great interest since the report of electroluminescent properties in poly(phenylene vinylene) (PPV). A large variety of polymers, copolymers, and their derivatives have been shown to exhibit electroluminescent properties. The configurations of these devices may consist of a simple single layer, bilayers, or blends used to enhance efficiency and tune the emission wavelength, or multilayers that may allow the device to operated under an applied voltage.

Typical single layer polymer LEDs are constructed by sandwiching a thin layer of luminescent conjugated polymer between two electrodes, an anode and a cathode, where at least one electrode is either transparent or semi-transparent. In some multilayer devices, charge injection and transport layers may be incorporated to improve device performance. A typical polymer LED fabrication process starts from a single indium-tin oxide (ITO) coated substrate, where the ITO acts as the anode. After careful cleaning, the polymer layers are then sequentially coated onto the substrate, usually by spin-casting techniques. Finally, a low work function metal is formed on top of the polymer layers by vacuum deposition techniques such as thermal evaporation or sputtering. This method of producing polymer LEDs has proven to be costly for large area applications.

Conjugated polymer light emitting devices offer substantial advantages over their inorganic counterparts such as solution processibility, easy band gap tunability, and mechanical flexibility. One unique advantage of conjugated polymer LEDs is their potential for web based roll-to-roll processing, whereby the cost of manufacturing polymer LEDs for large area applications can be significantly reduced. In the past few years, polymer LEDs have made remarkable progress toward commercialization. The effort, however, has been mainly focused on small area applications.

It is thus an object of the present invention to provide a method of fabrication that provides a fast, inexpensive means of fabricating polymer light emitting devices suitable for large area applications.

Although described with respect to the field of light-emitting devices driven by an electric field, it will be appreciated that similar advantages of lamination used in fabricating polymer devices, as well as other advantages, may obtain in other applications of the present invention. Such advantages may become apparent to one of ordinary skill in the art in light of the present disclosure or through practice of the invention.

SUMMARY OF THE INVENTION

The present invention includes methods for fabricating electroluminescent polymer devices and electroluminescent polymer systems by lamination. The methods of the present invention may be used in fabricating unipolar LED devices, bipolar SCALE devices and bipolar two-color SCALE devices. The methods of the present invention may be applied using procedures and protocols known and used in the arts to which they pertain. The present invention may be used to upgrade, repair, or retrofit existing machines or instruments using those aspects of the invention, using methods and components used in the art.

In broadest terms, the method of the present invention for fabricating polymer light emitting devices by lamination comprises: (1) obtaining a first member, where the first member includes a layer of a first electrode material, and a second member, where the second member includes a layer of a second electrode material; and at least one of said first and second members contains a layer of a light-emitting material capable of functioning as a light-emitting layer in a light-emitting device; and (2) laminating the first and second members so as to produce a laminate having said at least one light-emitting material between the first and second electrode materials. Either the first or second member, or both, may contain a layer of polymer selected from the group consisting of conducting and semi-conducting polymers, such as polyanilines, polythiophenes, polypyrroles, their derivatives, copolymers and blends thereof, and may also contain an outer layer of substrate material. The substrate material may be substantially impermeable to either oxygen or water. The substrate may be transparent. Further, the substrate may be rigid, resisting deformation from forces exerted by the human hand, or flexible, easily deformed by hand force. The laminate may comprise opposing electrical contact surfaces of the first and second members, and may be conducted such that at least one area of the laminate is sufficiently incompletely laminated such that the light-emitting device containing the laminate functions only upon application of pressure to the laminate. The laminate may alternatively comprise opposing electrical contact surfaces of the first and second member, where the opposing electrical contact surfaces are maintained in a spaced relationship by a layer of a spacing material in at least one area of the laminate, such that the light-emitting device containing the laminate functions only upon application of pressure to the laminate. The spacing material may be selected from the group consisting of aerogel materials and foamed materials.

The present invention also includes a method for preparing a layered composite capable of forming a light-emitting device comprising the steps: (1) obtaining a first member, where the first member comprises an outer layer of an electrode-bearing substrate material, and a second member, where the second member comprises an outer layer of an electrode-bearing substrate material; at least one of the first and said second members may comprise one or more layers of a light-emitting material capable of functioning as a light-emitting layer in a light-emitting device; and the inner side of either the first member and the second member, or both, comprises a polymer selected from the group consisting of conducting and semi-conducting polymers; and (2) laminating the first and second members so as to produce a laminate having said at least one light-emitting material between the first electrode material and the second electrode material. The conducting or semiconducting polymer may be selected from the group consisting of polyanilines, polythiophenes, polypyrroles, their derivatives, their copolymers and blends thereof, and the substrate material may be substantially impermeable to either oxygen or water.

The electrodes of the present invention may be patterned, such as for pixelation.

Examples of light emitting molecules that may be used in the emitting layer include: tris(8-quinolinolato)aluminum, bis(2-(2-hydroxyphenyl)pyridinato)beryllium, anthracene, tris(2-phenylpyridine)iridium doped in a host of 4,4'-N,N'-dicarbazol-biphenyl, their derivatives and blends thereof.

Examples of light emitting oligomers that may be used in the emitting layer include: oligo(phenylenevinylene)s, sexithiophene, oligo(thiophene)s, oligo(pyridine)s, their derivatives and blends thereof.

Examples of light emitting polymers that may be used in the emitting layer include: poly(arylene vinylene)s, poly(phenylene)s, poly(fluorene)s, poly(vinyl carbazole), poly(pyridine), poly(pyridyl vinylene), poly(phenylene vinylene pyridyl vinylene), their derivatives, their copolymers and blends thereof.

The present invention also includes a method for preparing a layered composite capable of forming a light-emitting device comprising the steps: (1) obtaining a first member, where the first member comprises an outer layer of a substrate material, and a second member, where the second member comprises an outer layer of a substrate material; both the first and said second members comprise layers of a light-emitting material capable of functioning as a light-emitting layer in a light-emitting device; the substrate material of the first and second members comprises an electrode material substantially impermeable to either oxygen or water; and the inner side of the first and second member comprises a polymer selected from the group consisting of polyanilines, polythiophenes, polypyroles, their derivatives, their copolymers and blends thereof; and (2) laminating the first and second members so as to produce a laminate having said at least one light-emitting material between the first electrode material and the second electrode material.

DETAILED DESCRIPTION OF THE PREFERRED EMBODIMENTS

In accordance with the foregoing summary, the following present a detailed description of the preferred embodiment of the invention that is currently considered to be the best mode.

The fabrication of working light emitting devices by laminating two pieces together can be accomplished using a conducting polymer such as sulfonated polyaniline (SPAN) or other fully or partially doped polyanilines (e.g. PAN-CSA, PAN-HCI), polypyrroles (e.g. PPy-PF$_6$), polythiophenes (e.g. PEDOT-PSS), or a semiconductive polymer such as the emeraldine base form of polyaniline. The conducting polymer layers allow good electrical contact when the two pieces are held together by pressure or other physical or chemical bonding. The laminated fabrication allows a very inexpensive and fast means to fabricate polymer light emitting devices that are suitable for large area applications.

Figure 1:
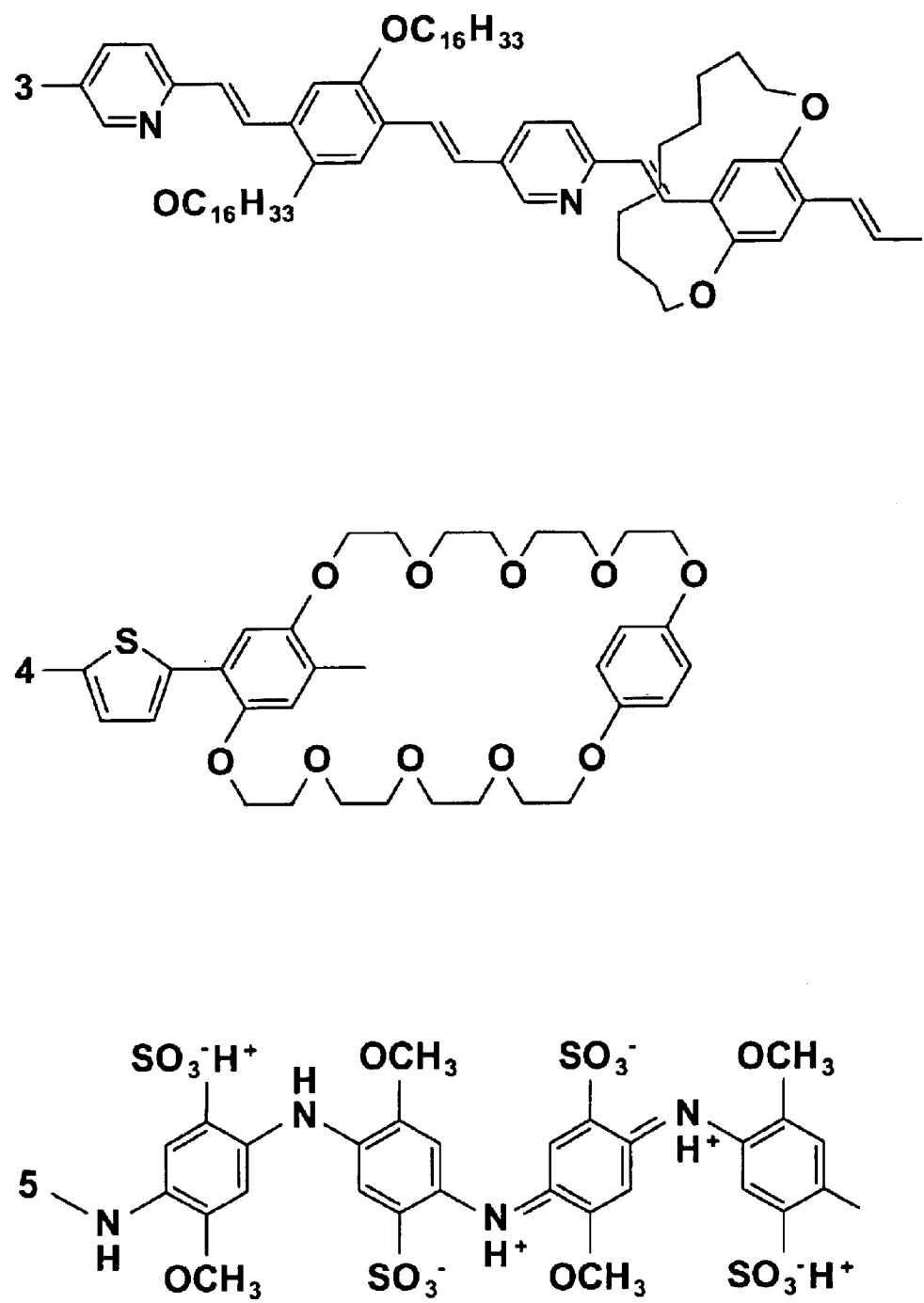
FIG. 1 shows repeat units of materials of the present invention.
Figure 2:
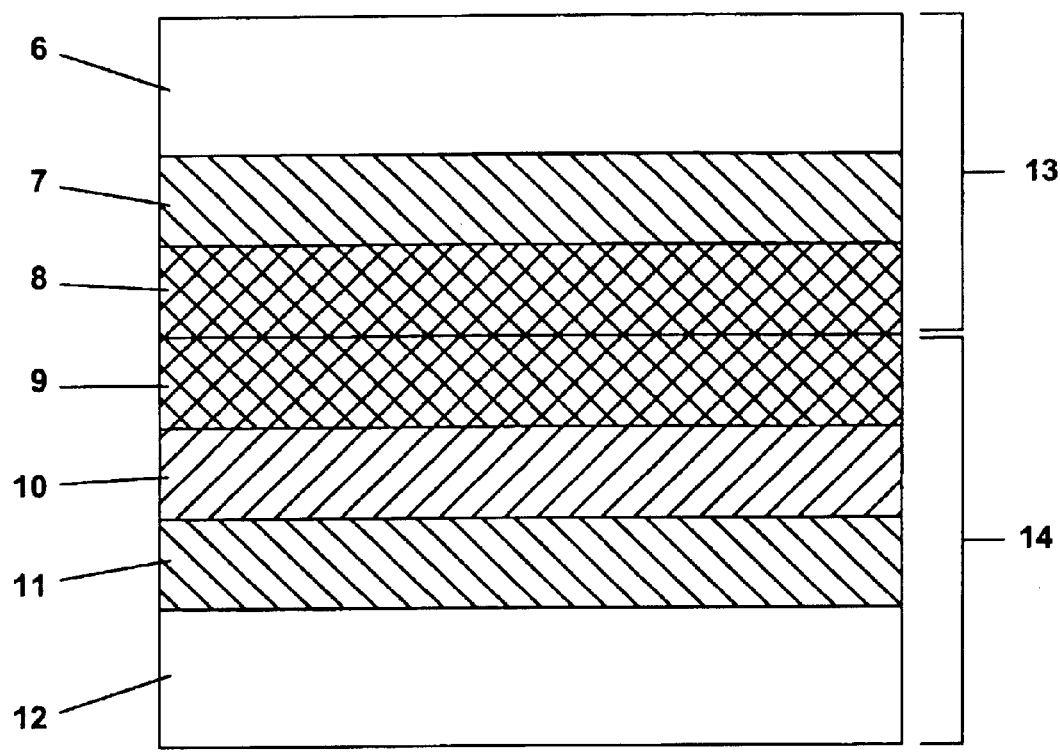
FIG. 2 is a is a side elevation view of a two-piece laminated polymer light emitting device of the present invention.

In a typical device fabrication process for a two-piece laminated device Substrate/ITO/PPyVPV:PTP/SPAN/SPAN/ITO/Substrate, an example of which is shown in FIG. 2, a blend of a copolymer of poly(pyridyl vinylene) and poly(phenylene vinylene) derivative, poly(pyridyl vinylene phenylene vinylene) (PPyVPV), and a copolymer of polythiophene and polyphenylene derivative, poly(thienylene phenylene) (PTP), are used as the emitting materials. The blend of PPyVPV and PTP has successfully been used as active layers in SCALE devices, particularly color variable bipolar/AC light emitting devices. Sulfonated polyaniline (SPAN) can be used as the connecting medium. SPAN is a water soluble self doped conducting polymer with a conductivity of ~0.01 S/cm. FIG. 1 shows the chemical structures of PPyVPV 3, PTP 4, and SPAN 5. The structure of the two pieces for the laminated device is shown schematically in FIG. 2. For the first piece 14, the PPyVPV:PTP (3:2 weight ratio) blend layer 10 may be formed by spin-casting at ~2000 rpm from trichloroethylene or xylenes solution (total concentration of ~10 mg/ml) onto pre-cleaned patterned ITO coated 11 glass substrate 12 or flexible PET substrate. The SPAN layer 9 may be subsequently spin coated over the emitting layer 10 from an aqueous solution (20 mg/ml). In order to minimize the probability of cross-talk in a pixelated display, a blend of SPAN and poly(vinyl alcohol) (PVA) (1:1 weight ratio) may be used to reduce the lateral conductance between the pixels. For the second piece 13, the SPAN layer 8 may be spin-coated at ~2000 rpm onto pre-cleaned patterned ITO coated 7 glass substrate 6 or flexible PET substrate. Again, in order to minimize the probability of cross-talk in a pixelated display, a blend of SPAN and poly(vinyl alcohol) (PVA) (1:1 weight ratio) may be used to reduce the lateral conductance between the pixels. After drying, the two pieces may be held together by pressure or other physical or chemical bonding processes.

This device may be a color variable bipolar device. The device can generate light in either polarity of the driving voltage when a pressure is applied to the device using, for example, the rubber tip on a pencil. The device may generate red light when the device is "forward" biased (ITO on the first piece positive) and green light when it is "reverse" biased (ITO on the second piece positive).

It is noted that in the above configuration where ITO was used as the electrode for both pieces, thin SPAN layers may be used whereby the device can be substantially transparent and thus suitable for uses such as in "head up" displays. This opens the opportunity to fabricate inexpensive transparent light emitting displays. When device transparency is not an issue, the second piece can simply be thin metal sheets, such as aluminum or steel foil, or aluminum or steel foil coated with SPAN.

The role of the SPAN layer in the example device may be two-fold. First, being an acidic redox polymer, it can serve as the protonation agent to protonate the PPyVPV layer producing red light, as in the case of the bipolar/AC devices reported earlier using Al as the top electrode. Second, being a self-doped conducting polymer, it can serve as the contacting agent that connects the two pieces together. In the above device, the presence of the SPAN layers may be essential. Without the SPAN layer (or other conducting or semiconducting layer), it may not be possible to fabricate working two-piece devices where the emitting layer on the first ITO piece is in direct contact with the second ITO piece.

With the assistance of the SPAN or other conducting or semiconducting layers, a variety of two-piece devices can be fabricated. The conducting or semiconducting layers may be used between any of the layers for purposes of lamination. Considering an example comprising a top substrate, a layer acting as a cathode under the top substrate, a layer acting as an emitter under the cathode, a layer acting as an anode under the emitting layer, and a bottom substrate under the anode layer, a device can be imagined whereby the two pieces to be laminated are divided between any two adjacent layers. For example, the layers could be divided between the emitting layer and the anode layer, or the anode layer and the bottom substrate. Each of the layers adjacent to the division could then be coated with a respective conducting or semiconducting layer to act as a contacting agent for purposes of lamination. It is also noted that different conducting or semiconducting polymers may be used as the top layer of each of the two pieces to be laminated together.

Materials and Methods

Following are other examples of working devices for which fabrication has been demonstrated through lamination techniques of the present invention:

Substrate/ITO/PPyVPV/SPAN/SPAN/ITO/Substrate: This device was fabricated similarly with the Substrate/ITO/PPyVPV:PTP/SPAN/SPAN/ITO/Substrate device except that pure PPyVPV was used as the emitting layer instead of the blend of PPyVPV and PTP. This is also a bipolar device. The device emits red light under forward bias and orange-yellow light under reverse bias.

Substrate/ITO/PPyVPV:PTP/PEDO T-PSS/PEDOT-PSS/ITO/Substrate: This device was fabricated similarly with the Substrate/ITO/PPyVPV:PTP/SPAN/SPAN/ITO/Substrate device except that contacting materials used is PEDT-PSS. This is also a color variable bipolar device. The device emits red light under forward bias and green light under reverse bias.

Substrate/ITO/PVK/PPyVPV/SPAN/SPAN/ITO/Substrate: For the first piece, poly(N-vinyl carbazole) (PVK) layer was spin-coated at ~3000 rpm from tetrahydrofuran (THF) or dichloroethane solution (total concentration of ~10 mg/ml) onto pre-cleaned patterned ITO coated glass or flexible PET substrate. The PPyVPV layer was then coated on top of the PVK layer from xylenes solution at ~2000 rpm. The SPAN layer was subsequently spin coated over the PPyVPV layer from an aqueous solution (20 mg/ml). The second piece was similarly fabricated as the above example. This device is a unipolar device that emits green light only in forward bias.

The novel two-piece lamination fabrication technique of the present invention eliminates the need for evaporated metal electrodes, allowing quick and easy fabrication. Also, the devices can be self-sealed and compatible with web processing for low cost, large quantity production. These devices have many potential applications. They can be used as pressure writing devices that light up when a pressure is applied and turned off when the pressure is removed. They can be used as automatic pressure-mapping devices when the pressure and light output are carefully calibrated. They also can be used as information "transducers" through coupling of the light output to a photosensitive recording medium.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

References

1. J. H. Burroughes, D. D. C. Bradley, A. R. Brown, R. N. Marks, K. Mackay, R. H. Friend, P. L. Burns, and A. B. Holmes, *Nature* 347, 539 (1990).
2. Y. Z. Wang, D. D. Gebler, D. K. Fu, T. M. Swager, and A. J. Epstein, *Appl. Phys. Lett.* 70, 3215 (1997).
3. Y. Z. Wang, D. D. Gebler, D. K. Fu, T. M. Swager, and A. J. Epstein, *Proc. SPIE* 3148, 117 (1998).
4. Y. Z. Wang, R. G. Sun, D. K. Wang, T. M. Swager, and A. J. Epstein, *Appl. Phys. Lett.* 74, 2593 (1999).

The foregoing references are hereby incorporated herein by reference.

What is claimed is:

1. A method for preparing a layered composite capable of forming a light-emitting device, said method comprising the steps:

(a) obtaining a first member, said first member comprising a layer of a first electrode material, and a second member, said second member comprising a layer of a second electrode material; and at least one of said first and second members comprises at least one layer of at least one light-emitting material capable of functioning as a light-emitting layer in a light-emitting device; and (b) laminating said first and second members so as to produce a laminate having said at least one light-emitting material between said first electrode material and said second electrode material.

2. A method according to claim 1 wherein at least one of said first and second members additionally comprises a layer of a polymer selected from the group consisting of conducting and semi-conducting polymers.

3. A method according to claim 2 wherein said polymer is selected from the group consisting of polyanilines, polythiophenes, polypyrroles, their derivatives, their copolymers and blends thereof.

4. A method according to claim 1 wherein said first member and said second member each additionally comprise a layer of a polymer selected from the group consisting of conducting and semi-conducting polymers.

5. A method according to claim 4 wherein said polymer is selected from the group consisting of polyanilines, polythiophenes, polypyrroles, their derivatives, their copolymers and blends thereof.

6. A method according to claim 1 wherein at least one of said first and second members additionally comprises an outer layer of a substrate material.

7. A method according to claim 6 wherein said substrate material is transparent.

8. A method according to claim 6 wherein said substrate material is substantially impermeable to either oxygen or water.

9. A method according to claim 6 wherein said substrate material is rigid.

10. A method according to claim 6 wherein said substrate material is flexible.

11. A method according to claim 1 wherein said first member and said second member each additionally comprise an outer layer of a substrate material.

12. A method according to claim 1 wherein said laminate comprises opposing electrical contact surfaces of said first and second member, and is conducted such that at least one area of said laminate is sufficiently incompletely laminated such that said light-emitting device comprising said laminate functions only upon application of pressure to said laminate.

13. A method according to claim 1 wherein said laminate comprises opposing electrical contact surfaces of said first and second member, said opposing electrical contact surfaces maintained in a spaced relationship by a layer of a spacing material in at least one area of said laminate, such that said light-emitting device comprising said laminate functions only upon application of pressure to said laminate.

14. A method according to claim 13, wherein said spacing material is selected from the group consisting of aerogel materials and foamed materials.

15. A method according to claim 1, wherein at least one of said at least one light-emitting layer comprises a light emitting molecule selected from the group consisting of tris(8-quinolinolato)aluminum, bis(2-(2-hydroxyphenyl) pyridinato)beryllium, anthracene, tris(2-phenylpyridine) iridium doped in a host 4,4'-N,N'-dicarbazol-biphenyl, their derivatives and blends thereof.

16. A method according to claim 1, wherein at least one of said at least one light-emitting layer comprises a light emitting oligomer selected from the group consisting of oligo(phenylenevinylene)s, sexithiophene, oligo(thiophene)s, oligo(pyridine)s, their derivatives and blends thereof.

17. A method according to claim 1, wherein at least one of said at least one light-emitting layer comprises a light emitting polymer selected from the group consisting of poly(arylene vinylene)s, poly(phenylene)s, poly(fluorene)s, poly(vinyl carbazole), poly(pyridine), poly(pyridyl vinylene), poly(phenylene vinylene pyridyl vinylene), their derivatives, their copolymers and blends thereof.

18. The method according to claim 1, wherein said light-emitting device is a unipolar LED device.

19. The method according to claim 1, wherein said light-emitting device is a bipolar SCALE device.

20. The method according to claim 1, wherein said light-emitting device is a bipolar two-color SCALE device.

21. A method for preparing a layered composite capable of forming a light-emitting device, said method comprising the steps:
  (a) obtaining a first member, said first member comprising an outer layer of a substrate material, an electrode material, and a second member, said second member comprising an outer layer of a substrate material, a layer of an electrode material; at least one of said first and said second members comprises at least one layer of a light-emitting material capable of functioning as a light-emitting layer in a light-emitting device; and at least one said inner side of said first member and said second member comprising a polymer selected from the group consisting of conducting and semi-conducting polymers; and
  (b) laminating said first and second members so as to produce a laminate having said at least one light-emitting material between said first electrode material and said second electrode material.

22. A method according to claim 21 wherein said first member and said second member each additionally comprise a layer of a polymer selected from the group consisting of conducting and semi-conducting polymers.

23. A method according to claim 21 wherein said polymer is selected from the group consisting of polyanilines, polythiophenes, polypyrroles, their derivatives, their copolymers and blends thereof.

24. A method according to claim 21 wherein said first member and said second member each additionally comprise an outer layer of a substrate material.

25. A method according to claim 21 wherein said substrate material is substantially impermeable to either oxygen or water.

26. A method according to claim 21 wherein said light-emitting device is a unipolar LED device.

27. A method according to claim 21 wherein said light-emitting device is a bipolar SCALE device.

28. A method according to claim 21 wherein said light-emitting device is a bipolar two-color SCALE device.

29. A method according to claim 21 wherein said substrate material of said first member is transparent.

30. A method according to claim 21, wherein said substrate material of said second member is transparent.

31. A method according to claim 21 wherein said substrate material of said first member is rigid.

32. A method according to claim 21 wherein said substrate material of said first member is flexible.

33. A method according to claim 21 wherein said substrate material of said second member is rigid.

34. A method according to claim 21 wherein said substrate material of said second member is flexible.

35. A method according to claim 21, wherein at least one of said at least one layer comprises a light emitting molecule selected from the group consisting of tris(8-quinolinolato) aluminum, bis(2-(2-hydroxyphenyl )pyridinato)beryllium, anthracene, tris(2-phenylpyridine)iridium doped in a host 4,4'-N,N'-dicarbazol-biphenyl, their derivatives and blends thereof.

36. A method according to claim 21, wherein at least one of said at least one layer comprises a light emitting oligomer selected from the group consisting of oligo (phenylenevinylene)s, sexithiophene, oligo(thiophene)s, oligo(pyridine)s, their derivatives and blends thereof.

37. A method according to claim 21, wherein at least one of said at least one layer comprises a light emitting polymer selected from the group consisting of poly(arylene vinylene) s, poly(phenylene)s, poly(fluorene)s, poly(vinyl carbazole). poly(pyridine), poly(pyridyl vinylene), poly(phenylene vinylene pyridyl vinylene), their derivatives, their copolymers and blends thereof.

38. A method for preparing a layered composite capable of forming a light-emitting device, said method comprising the steps:
  (a) obtaining a first member, said first member comprising an outer layer of a substrate material, and a second member, said second member comprising an outer layer of a substrate material; both said first and said second members comprise at least one layer of a light-emitting material capable of functioning as a light-emitting layer in a light-emitting device; said substrate material of said first and second members comprises an electrode material substantially impermeable to either oxygen or water; and said inner side of said first member and said second member comprises a polymer selected from the group consisting of polyanilines, polythiophenes, polypyrroles, their derivatives, their copolymers and blends thereof; and
  (b) laminating said first and second members so as to produce a laminate having said at least one light-emitting material between said first electrode material and said second electrode material.

39. A method according to claim 38, wherein said substrate of said first member is transparent.

40. A method according to claim 38, wherein said substrate of said second member is transparent.

41. A method according to claim 38, wherein said light-emitting device is a unipolar LED.

42. A method according to claim 38, wherein said light-emitting device is a bipolar SCALE device.

43. A method according to claim 38, wherein said light-emitting device is a bipolar two-color SCALE device.

44. A method according to claim 38, wherein said substrate of said first member is rigid.

45. A method according to claim 38, wherein said substrate of said first member is flexible.

46. A method according to claim 38, wherein said substrate of said second member is rigid.

47. A method according to claim 38, wherein said substrate of said second member is flexible.

48. A method according to claim 38, wherein at least one of said at least one layer comprises a light emitting molecule selected from the group consisting of tris(8-quinolinolato) aluminum, bis(2-(2-hydroxyphenyl)pyridinato)beryllium, anthracene, tris(2-phenylpyridine)iridium doped in a host 4,4'-N,N'-dicarbazol-biphenyl, their derivatives and blends thereof.

49. A method according to claim 38, wherein at least one of said at least one layer comprises a light emitting oligomer selected from the group consisting of oligo(phenylenevinylene)s, sexithiophene, oligo(thiophene)s, oligo(pyridine)s, their derivatives and blends thereof.

50. A method according to claim 38, wherein at least one of said at least one layer comprises a light emitting polymer selected from the group consisting of poly(arylene vinylene)s, poly(phenylene)s, poly(fluorene)s, poly(vinyl carbazole), poly(pyridine), poly(pyridyl vinylene), poly(phenylene vinylene pyridyl vinylene), their derivatives, their copolymers and blends thereof.

* * * * *

UNITED STATES PATENT AND TRADEMARK OFFICE
CERTIFICATE OF CORRECTION

PATENT NO. : 6,833,283 B2
DATED : December 21, 2004
INVENTOR(S) : Epstein et al.

It is certified that error appears in the above-identified patent and that said Letters Patent is hereby corrected as shown below:

Title page,
Item [75], Inventors, please delete "Runguan Sun" and insert -- Runguang Sun --.

Column 5,
Lines 24-25, please delete "Substrate/ITO/PPyVPV:PTP/PEDO T-PSS/PEDOT-PSS/ITO/Substrate:" and insert -- Substrate/ITO/PPyVPV:PTP/PEDOT-PSS/PEDOT-PSS/ITO/Substrate: --.

Column 8,
Line 25, please delete "bis(2-(2-hydroxyphenyl )pyridinato)beryllium" and insert -- bis(2-(2-hydroxyphenyl)pyridinato)beryllium --.

Signed and Sealed this

Nineteenth Day of April, 2005

JON W. DUDAS
*Director of the United States Patent and Trademark Office*